United States Patent [19]

Frisina

[11] Patent Number: 5,886,381
[45] Date of Patent: Mar. 23, 1999

[54] MOS INTEGRATED DEVICE COMPRISING A GATE PROTECTION DIODE

[75] Inventor: Ferruccio Frisina, Sant'Agata li Battiati, Italy

[73] Assignee: Consorzio per la Ricerca sulla Microelettronica nel Mezzogiorno, Catania, Italy

[21] Appl. No.: 745,153

[22] Filed: Nov. 7, 1996

[30] Foreign Application Priority Data

Nov. 10, 1995 [EP] European Pat. Off. .............. 95830476

[51] Int. Cl.⁶ .......................... H01L 29/76; H01L 29/94; H01L 31/062; H01L 31/113
[52] U.S. Cl. ............................................. 257/328; 257/356
[58] Field of Search ................... 257/328, 356, 257/360

[56] References Cited

U.S. PATENT DOCUMENTS

| 4,492,974 | 1/1985 | Yoshida et al. .......................... 257/328 |
| 4,688,323 | 8/1987 | Yoshida et al. .......................... 257/328 |
| 4,760,434 | 7/1988 | Tsuzuki et al. .......................... 257/328 |
| 5,266,831 | 11/1993 | Phipps et al. .......................... 257/620 |

FOREIGN PATENT DOCUMENTS

| 000372820 | 6/1990 | European Pat. Off. ............... 257/356 |
| A-0 566 179 | 10/1993 | European Pat. Off. ........ H01L 27/02 |
| A-0 595 355 | 5/1994 | European Pat. Off. ........ H01L 27/02 |
| A-0 600 229 | 6/1994 | European Pat. Off. ........ H01L 27/02 |
| 402110976 | 4/1990 | Japan .................................... 257/356 |
| 403071673 | 3/1991 | Japan .................................... 257/328 |

OTHER PUBLICATIONS

European Search Report from European Patent Application 95830476.8, filed Nov. 10, 1995.

*Primary Examiner*—Stephen D. Meier
*Attorney, Agent, or Firm*—Wolf, Greenfield & Sacks, P.C.

[57] ABSTRACT

The device presents a polysilicon layer extending over a wafer of semiconductor material, along the edge of the active region of the device, and partly over a thick field oxide layer which externally delimits the active region. The polysilicon layer forms both a field-plate region at its inner edge, and a Zener protection diode over the field oxide layer, outwards of and contiguous to the field-plate region. The terminals of the diode are respectively connected to the source metal region and the gate metal region; the diode therefore extends along the whole of the perimeter of the device, and presents an extensive junction area without greatly reducing the active area of the device.

26 Claims, 3 Drawing Sheets

MOS INTEGRATED DEVICE COMPRISING A GATE PROTECTION DIODE

BACKGROUND OF THE INVENTION

1. Field of the Invention

The present invention relates to a MOS integrated device comprising a gate protection diode.

2. Discussion of the Related Art

As is known, power MOS technology is aimed at forming power components interfaceable directly with control logic circuits. As this implies a 3–5 V control voltage of the gate region of MOS devices, power MOS technology has tended to produce devices with a low threshold and, hence, thin gate oxide.

Moreover, in low-voltage (30–60 V) applications, a reduction in output resistance now obviously requires the use of scaled processes with ever-smaller channel lengths and gate oxide thicknesses.

As a result, currently used low-voltage power MOS transistors feature gate oxide thicknesses ranging from 200 to 500 A.

On the one hand, therefore, technological and application requirements demand thin gate oxides, whereas, on the other, application and quality standard requirements demand gate oxides capable of withstanding electrostatic charges. In order to determine whether the gate oxide thickness is able to accomodate these competing interests, test circuits have been devised, the most commonly used of which is shown in FIG. 1.

The test circuit 1 in FIG. 1 substantially comprises a capacitor 2, which is precharged to a test voltage (e.g. 20 V for transistors with a breakdown voltage of 50 V) and then discharged via a resistor 3 into the test transistor 4; the current through transistor 4 is measured by an ammeter 6; and any defective gate oxide is determined according to the current reading.

To protect the gate oxide of power MOS transistors described above from voltages greater than the gate oxide breakdown voltage, it has been proposed by the related art to integrate Zener diodes with a lower breakdown voltage than the gate oxide in any operating condition. This is shown schematically in FIG. 2, in which 10 indicates the power MOS transistor, and 11 indicates the Zener diode, which in this case is formed by a pair of back-to-back diodes 12, 13, and is located between the gate terminal G and source terminal S of transistor 10.

There are various ways of integrating a diode between the gate and source terminals of a MOS transistor, the simplest being to exploit the source-body junction with an inverse bias. According to this solution, a region similar to the source regions of the MOS transistor is formed in a special body well; the well is connected to the gate metal region; and the source-similar region is connected to the source metal region of the transistor.

The above solution, however, presents the disadvantage of inevitably involving a parasitic NPN transistor, which impairs the dynamic strength of the structure.

According to another known solution, protection diodes are integrated over the wafer of semiconductor material using the polysilicon layer used for the gate regions; such solution presents the advantage of eliminating any parasitic elements, by virtue of the diodes being located outside the wafer and separated electrically from it by a thick oxide layer.

The disadvantage of the above solution, however, lies in the need to minimize the area occupied by the protection diodes, to avoid an excessive reduction in the area available for the active device components, or an undesired increase in the overall size of the device. Generally speaking, it is desirable that protection diodes should occupy no more than 3–5% of the total area of the device, which size limitation, however, seriously impairs their effectiveness. In fact, the characteristic of a polysilicon diode presents, after the breakdown voltage, a far from negligible resistance (a few tens of ohms) which depends partly on the aluminium-polysilicon contact and partly on the area of the PN junction. In practice, diode characteristic VD is of the type:

$$VD=VZ+RZI$$

where VZ is the breakdown voltage (start of inverse conduction of the diode), RZ is the equivalent resistance of the inversely conducting diode, and I is the current through the diode.

In other words following breakdown voltage, the Zener diode is no longer capable of maintaining the breakdown voltage independently of the current flow, presenting a voltage drop which increases with the current. Consequently, in the event, for example, of RZ=30Ω, VZ=15 V, and an oxide breakdown voltage of 25 V, a current I≧350 mA is enough to make the protection diode ineffective, since the voltage across the diode becomes greater than the oxide breakdown voltage, destroying the gate oxide.

This is particularly undesirable when using ESD testing according to the circuit of FIG. 1 where the current through the diode may be as high as a few Amps. In such a case, in order to guarantee that the voltage across the diode will not exceed the gate oxide break-down voltage during high currents, the breakdown resistance RZ should be at most a few ohms (RZ<5Ω).

Thus, in view of the very small voltage margin (defined as VOX−VZ, where VOX is the oxide breakdown voltage) of particularly thin oxides, a problem exits where diodes are formed in the polysilicon layer, requiring very large junction and contact areas for the protection diode to function properly and therefore having breakdown resistances greater than the desired few ohms (SR). Also, the large areas required by the diodes as stated, is in direct conflict with the need to reduce the area occupied by the diodes in order to maximize the area for the active device.

SUMMARY OF THE INVENTION

It is therefore an object of the present invention to provide an integrated device of the aforementioned type featuring gate protection diodes, designed to overcome the drawbacks typically associated with known techniques. In particular, the integrated device should comprise protection diodes that are effective even in the case of very thin gate oxides, without involving an excessive increase in the overall area of the device.

According to one embodiment of the present invention, there is provided a MOS device integrated in a wafer of semiconductor material having a surface, said wafer of semiconductor material defining an active region having a perimeter, and said integrated device comprising:

at least one source region formed in said active region;

at least one gate region formed over and electrically insulated from said source region;

a layer of semiconductor material extending over said surface and along said perimeter, and electrically insulated from said wafer of semiconductor material, and a gate protection diode formed in said layer of semiconductor material, outside said perimeter, comprising;

a first contact region electrically contacting said source region, and a second contact region electrically contacting said gate region.

BRIEF DESCRIPTION OF THE DRAWINGS

A number of preferred, non-limiting embodiments of the present invention will be described by way of example with reference to the accompanying drawings, in which.

DETAILED DESCRIPTION

Figure 3:
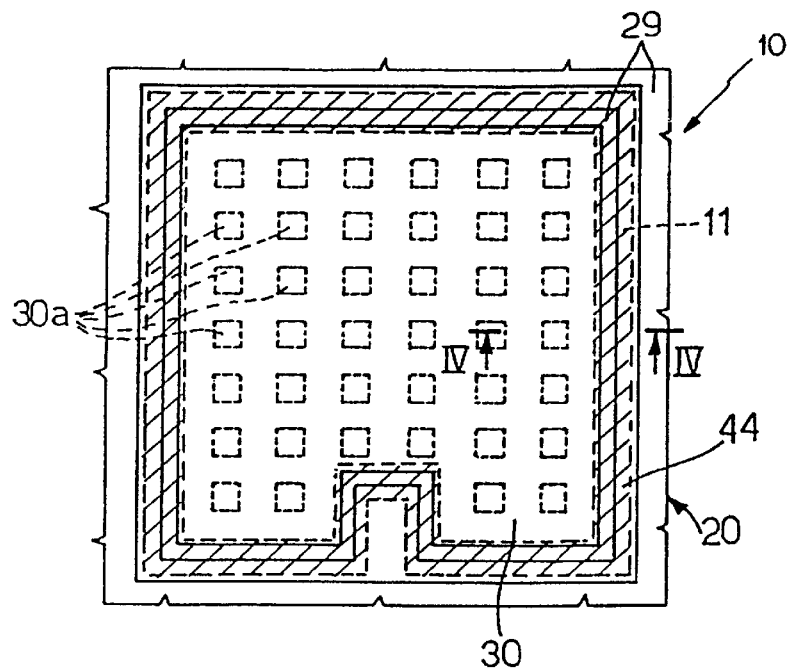
FIG. 3 shows a top plan view of one embodiment of the device according to the present invention.
Figure 4:
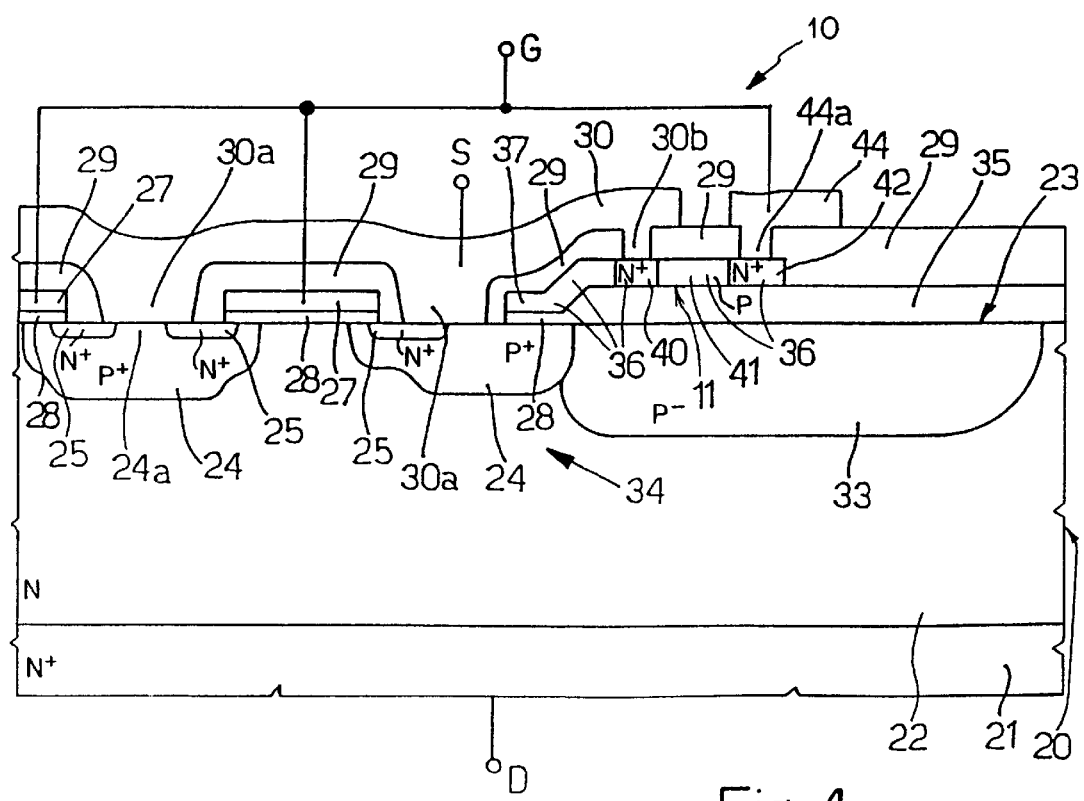
FIG. 4 shows a cross section along line IV—IV of a portion of the FIG. 3 device.
Figure 5:
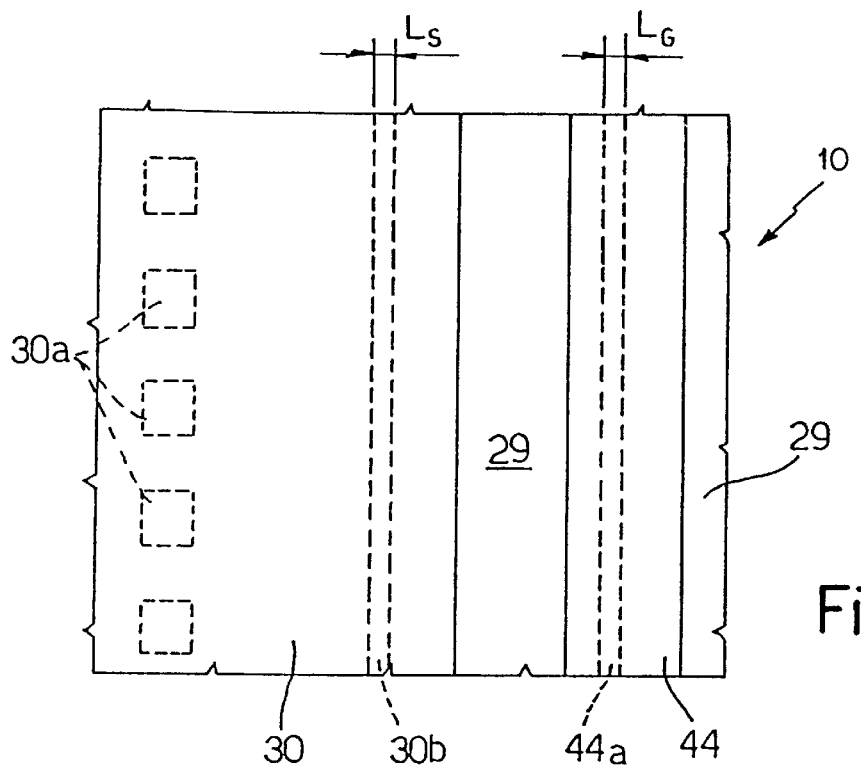
FIG. 5 shows a top plan view of an enlarged detail of the FIG. 3 device.

FIGS. 3–5 show a power MOS transistor 10 integrated in a wafer 20 of semiconductor material comprising a first N+ type region 21 connected to a drain terminal D, and a second N type region 22 over region 21 and presenting a surface 23. P+ type body regions 24 are housed, facing surface 23, inside second region 22, and in turn house N+ type source regions 25 separated by respective portions 24a of body regions 24. Polysilicon gate regions 27 are located on surface 23, between pairs of body regions 24, and are insulated electrically from surface 23 by a gate oxide layer 28. A thick oxide layer 29 surrounds the gate regions and separates them electrically from a source metal region 30 extending over wafer 20 and electrically contacting source regions 25 and portions 24a of body region 24 by means of contact regions 30a.

A P-type edge ring 33 formed in second region 22 fully surrounds the portion in which body regions 24 are formed (active area 34), and is located beneath a thick field oxide layer 35. A polysilicon layer 36 extends partly over field oxide layer 35 and partly over active area 34, and is separated electrically from surface 23 by gate oxide layer 28.

As shown in FIG. 4, polysilicon layer 36 forms both a field-plate region 37 at its inner edge, and a Zener diode 11 over field oxide layer 35 and adjacent to field-plate region 37. More specifically, diode 11 comprises portions 40, 41, 42, which are so doped as to present respective conductivity types N+, P and N+. Portions 40–42 have a concentric annular shape with portion 40 adjacent to field-plate region 37, portion 41 adjacent to but outwards of portion 40, and portion 42 adjacent to but outwards of portion 41. Portion 40 is located beneath and close to the outer edge of source metal region 30, and is connected to it by a contact portion 30b extending through thick oxide layer 29; and portion 42 is located beneath and connected to a gate metal region 44 (fully surrounding the transistor, outside active area 34, as shown in FIG. 3) by a contact portion 44a also extending through thick oxide layer 29.

As such, diode 11 extends about the whole perimeter of transistor 10, and is formed in the polysilicon layer 36 already provided for forming field-plate region 37 for increasing the voltage-strength of the structure, and for forming annular gate metal region 44 for reducing the gate resistance. The peripheral arrangement of diode 11 is shown clearly in FIG. 3, in which the portion of polysilicon layer 36 in which diode 11 is formed (not directly visible) is shown hatched.

The above structure therefore provides for inserting an extremely large-area Zener diode 11 with no loss in the active area of the device; and the fact that Zener diode 11 is located over field oxide layer 35, and is separated by the thickness of it (roughly 1 $\mu$m) from wafer 20, makes a special polysilicon island superfluous.

As shown in FIG. 4, the area of Zener diode 11 therefore equals the perimeter of the transistor times the thickness of polysilicon layer 36. The contact area of contact portions 30b, 44a of metal regions 30, 44 extends along the whole of the junction on the perimeter, and equals:

$$AC,S = PS \times LS;$$

$$AC,G = PG \times LG$$

where AC,S and AC,G are respectively the contact area of the source and gate metal regions; PS and PG are respectively the length of the perimeter of source and gate contact portions 30b, 44a (approximately corresponding to the inside and outside perimeters of diode 11); and LS and LG are respectively the width of the same contact portions (FIG. 5).

For a 10 mm2 (roughly 3 mm square) transistor 10 with a 0.5 $\mu$m thick polysilicon layer 36 and LS=LG=4 $\mu$m, it is therefore possible to form a diode with an area A of 6000 $\mu$m 2 and a contact area of 48000 $\mu$m 2. By way of comparison, to form a diode of the same size using the known solution described previously, a polysilicon island of roughly 0.5–1 mm2, equal to 5–10% of the transistor area, would be required, at the expense of the active cells of the transistor.

Figure 6:
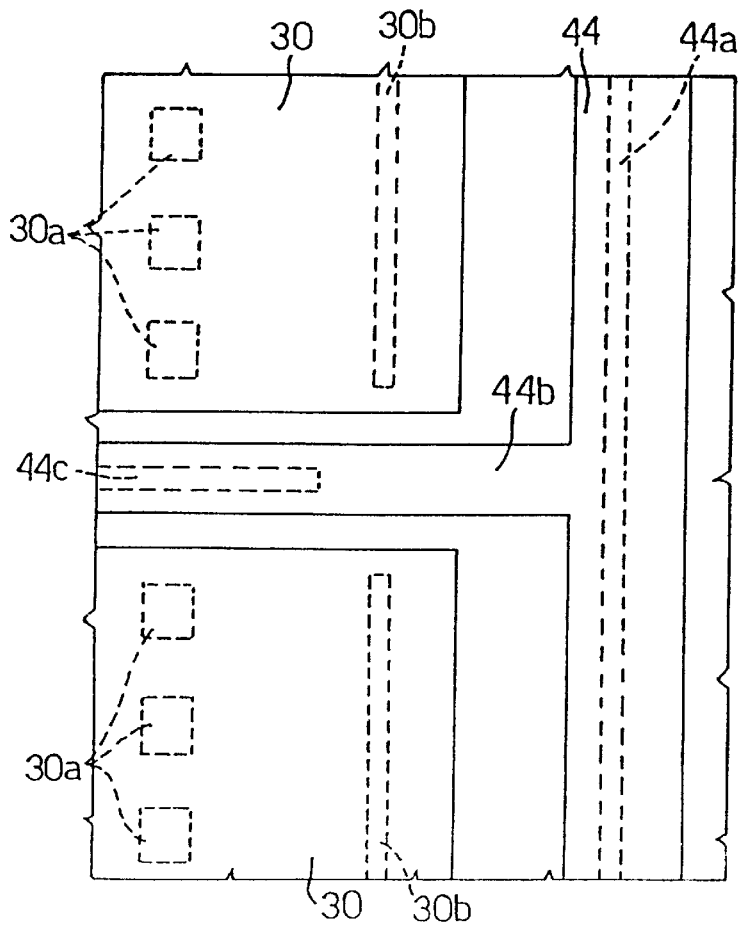
FIG. 6 shows a top plan view of an enlarged detail of a further embodiment of the FIG. 3 device.

Forming the diode in the polysilicon layer, adjacent to field-plate region 37, also enables the formation, if necessary, of gate fingers extending from any point of metal region 44, as shown by way of example in FIG. 6 illustrating an enlarged detail of transistor 10, and in which, from peripheral gate metal region 44, there extends a metal "finger" 44b with a contact portion 44c for contacting the polysilicon gate strips (not shown).

Figure 1:
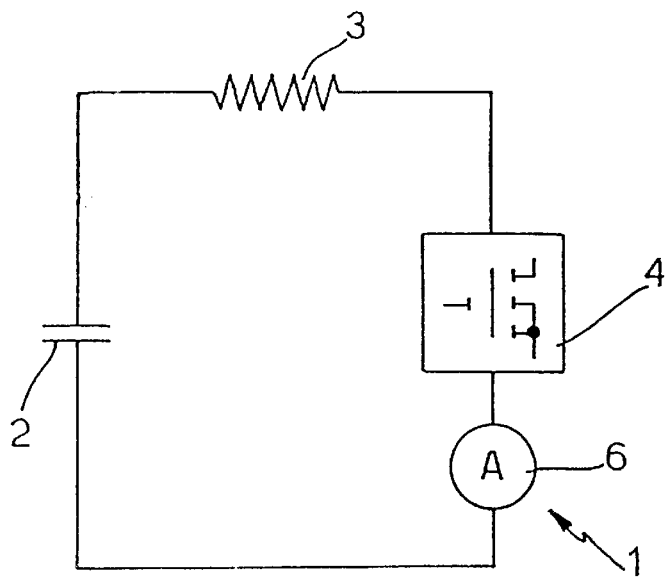
FIG. 1 shows a known test circuit.
Figure 2:
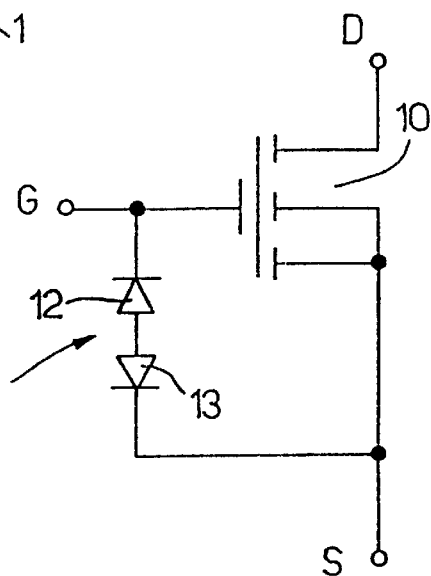
FIG. 2 shows the electric diagram of a known integrated transistor to which the present invention is applied.
Figure 7:
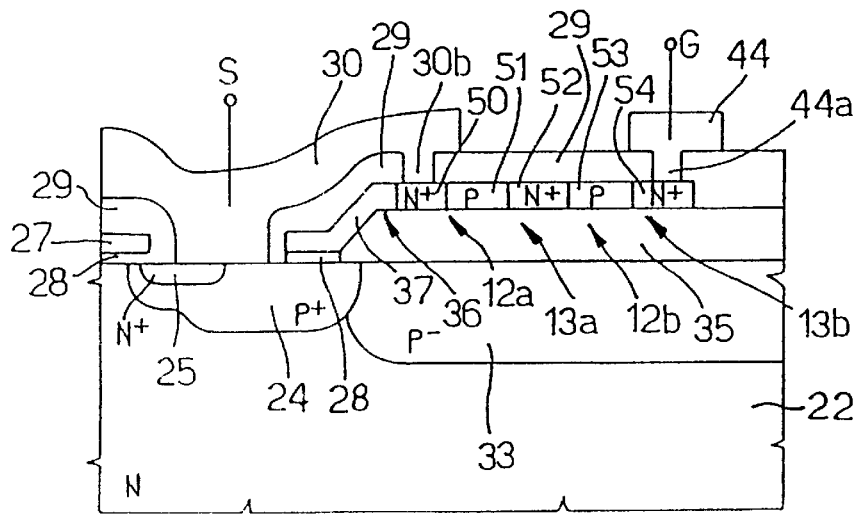
FIG. 7 shows a cross section of a further embodiment of the device according to the present invention.

If the voltage which the Zener diode must ensure is higher than the breakdown voltage of a single diode, then a number of diodes in series may be provided between the source and gate contact portions. FIG. 7, for example, shows two pairs of diodes 12a, 12b, 13a, 13b. More specifically, starting from the outer edge of field-plate region 37 in FIG. 7, polysilicon layer 36 houses an N+ type region 50 contacting source contact portion 30b; a P type region 51 adjacent to region 50; an N+ type region 52 adjacent to region 51; a P type region 53 adjacent to region 52; and an N+ type region 54 adjacent to region 53 and contacting gate contact portion 44a. Regions 50, 51 form diode 12a; regions 51, 52 form diode 13a; regions 52, 53 form diode 12b; and regions 53, 54 form diode 13b.

Clearly, changes may be made to the device as described and illustrated herein without, however, departing from the scope of the present invention. In particular, as opposed to extending annularly about the whole of active area 34, the polysilicon portions 40–42 50–54 forming the protection diode/s may only extend over appropriate portions, and need not necessarily be concentric.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A MOS device formed on a wafer of semiconductor material, the wafer having a perimeter, the device comprising:

an active region including at least one gate and at least one source region;

a channel-stop region along the perimeter of the wafer and fully surrounding the active region, the channel-stop region including an edge ring and a thick field oxide layer, the edge ring formed outside of the active region and located beneath the thick field oxide layer;

a gate protection means having first and second contacts, the gate protection means being formed outside of the active region and over the channel-stop region, for protecting the at least one gate from excess voltage;

a single source metal region extending over the active region and contacting the first contact of the gate protection means and the at least one source region; and a gate metal region that extends outside of the single source metal region and the active region, is electrically insulated from the single source metal region, contacts the second contact of the gate protection means and is electrically connected to the at least one gate.

2. The device as in claim 1, wherein the at least one gate has a first breakdown voltage and the g protection means has a second breakdown voltage, the second breakdown voltage being smaller than the first breakdown voltage.

3. The device as in claim 1, further including a semiconductor layer extending along the perimeter, wherein the gate protection means is formed in the semiconductor layer.

4. The device as in claim 3, wherein the semiconductor layer includes a field-plate region adjacent to and inwardly adjoining the gate protection means.

5. The device as in claim 3, wherein the semiconductor layer is made of polycrystalline silicon.

6. The device as in claim 1, wherein the gate protection means extends along the whole perimeter of the wafer.

7. The device as in claim 1, wherein the gate protection means extends along part of the perimeter of the wafer.

8. The device as in claim 1, wherein the gate protection means includes at least one pair of back-to-back diodes.

9. The device as in claim 1, wherein the gate protection means includes a number of contiguous, concentric annular portions of opposite conductivity.

10. The device as in claim 1, wherein the gate protection means includes a number of contiguous, nonconcentric annular portions of opposite conductivity.

11. The device as in claim 1, wherein the gate protection means includes a number of contiguous, concentric nonannular portions of opposite conductivity.

12. The device as in claim 1, wherein the gate protection means includes at least two pairs of back-to-back diodes.

13. The device as in claim 12, wherein the two pairs of diodes extend annularly and concentrically about the whole active region.

14. The device as in claim 12, wherein the diodes extend annularly but not concentrically about the whole active region.

15. The device as in claim 12, wherein the diodes extend substantially around the whole active region.

16. The device as in claim 1, further including a plurality of gate fingers extending from the gate metal region.

17. The device as in claim 1, wherein the gate protection means is separated from the wafer by a predetermined thickness so as to make a polysilicon island superfluous.

18. The device as in claim 1, wherein the gate protection means includes a Zener diode.

19. An integrated MOS device in a wafer of semiconductor material having an active region and a channel-stop region along a perimeter of the wafer and fully surrounding the active region, the device comprising:

at least one source region formed in the active region;

a first layer of semiconductor material formed over and electrically insulated from the at least one source region;

at least one gate region formed in the first layer of semiconductor material;

a second layer of semiconductor material, different from the first layer, extending over the channel-stop region and along the perimeter, and electrically insulated from the wafer of semiconductor material;

a gate protection diode having first and second contacts, the diode being formed within the second layer of semiconductor material, outside the active region and over the channel-stop region;

a single source metal region, extending over the active region and the at least one gate region, contacting the first contact of the gate protection diode and the at least one source region; and a gate metal region, extending outside the single source metal region and over the channel-stop region, electrically insulated from the single source metal region, contacting the second contact of the gate protection diode and electrically connected to the at least one gate region.

20. The device as in claim 19, wherein the first and second layers of semiconductor material each is made of polycrystalline silicon.

21. The device as in claim 19, wherein the gate protection diode extends along the whole perimeter of the wafer.

22. The device as in claim 21, wherein the gate protection diode includes a number of contiguous, concentric annular portions of opposite conductivity.

23. The device as in claim 19, wherein the second layer of semiconductor material includes a field-plate region adjacent to and inwardly adjoining the gate protection diode.

24. The device as in claim 19, wherein the channel-stop region includes a field oxide layer, and wherein the gate protection diode is formed over the field oxide layer.

25. The device as in claim 19, wherein the gate protection diode includes a pair of back-to-back diodes.

26. The device as in claim 19, wherein the gate protection diode includes at least two pairs of back-to-back diodes.

* * * * *